United States Patent [19]

Gunmar et al.

[11] Patent Number: 5,151,704

[45] Date of Patent: Sep. 29, 1992

[54] METHOD FOR SIMULATING THE EFFECT OF ALTERNATIVE ANTENNA PATTERNS ON THE COVERAGE AND INTERFERENCE PATTERN OF A MOBILE RADIO SYSTEM

[75] Inventors: Krister Gunmar; Ulf Tegth, both of Haninge, Sweden

[73] Assignee: Televerket, Farsta, Sweden

[21] Appl. No.: 821,868

[22] Filed: Jan. 16, 1992

Related U.S. Application Data

[63] Continuation of Ser. No. 591,465, Oct. 1, 1990, abandoned.

[30] Foreign Application Priority Data

Sep. 29, 1989 [SE] Sweden .................. 8903210

[51] Int. Cl.⁵ .................. H01Q 3/00; G01R 7/00; H04Q 7/00
[52] U.S. Cl. .................. 342/360; 343/703; 455/33.3
[58] Field of Search .............. 342/360, 169; 343/703; 364/578, 579; 434/2; 455/33

[56] References Cited

U.S. PATENT DOCUMENTS 4,926,186   5/1990   Kelly et al. .................. 342/360

FOREIGN PATENT DOCUMENTS 9010341   9/1990   World Int. Prop. O. .
9010342   9/1990   World Int. Prop. O. .

*Primary Examiner*—Gregory C. Issing
*Attorney, Agent, or Firm*—Oblon, Spivak, McClelland, Maier & Neustadt

[57] ABSTRACT

The present invention provides a method for simulating the effect of alternative antenna patterns on the coverage and interference pattern of a mobile radio system. The method is mainly characterized by the fact that signal strength values of an existing antenna are measured for relevant coordinates, the ideal difference in antenna gain is formed by "reducing" the ideal radiation pattern of the antenna which is to be simulated with the ideal radiation pattern of the existing antenna, and the measured field strength values are "weighted" with the ideal antenna gain difference to form a set of simulated field strength values.

2 Claims, No Drawings

METHOD FOR SIMULATING THE EFFECT OF ALTERNATIVE ANTENNA PATTERNS ON THE COVERAGE AND INTERFERENCE PATTERN OF A MOBILE RADIO SYSTEM

This application is a continuation of application Ser. No. 07/591,465 filed on Oct. 1, 1990, now abandoned.

FIELD OF THE INVENTION

The present invention relates to a method for determining the coverage and interference pattern of a mobile radio system and it is intended to predict the consequences of using different placements of antennas by a simulation of their placement in cell planning. The invention thus provides a planning aid in radio cell planning and is directly related to the problems set forth in Swedish Patent Applications 8900742-1 corresponding to PET/SE90/00119, 8900743-9, 8900744-7 and 8900745-4 (all three of which corresponds to PCT/SE90/00130) and especially to the invention "Method for radio cell planning" (8900744-7). The invention is based on the fact that the signal strengths received by mobile units in a mobile radio system from all base stations can be measured along the routes from which the majority of the mobile radio traffic is handled. This means that extremely realistic models can be used in the study of the characteristics of the mobile radio system.

PRIOR ART

A new measuring method developed at Televerket Radio provides a detailed pattern of the wave propagation in a metropolitan area, in which the characteristics of existing antennas are implicitly included in the measurement results. The present state of the art, as regards assessment of the effect of antennas in radio cell systems, is to a great extent determined by the fact that the detailed wave propagation characteristics are not well known in metropolitan areas. A completely new situation arises as a result of the said measuring method. In the application of the invention, a reference radio cell is used for which the signal strengths received by mobile units are known with very great accuracy These signal strengths are based both on the antenna characteristics of the base station in the cell and wave propagation characteristics in the radio channel towards the mobile unit. The antennas used in metropolitan areas frequently have a very irregular radiation pattern which are difficult to predict. If the antenna is changed in the reference system, it has thus been difficult to say anything about how the new radiation pattern is related to the old one without new measurements.

SUMMARY OF THE INVENTION

According to the invention, a method is provided for studying by simulation in a mobile radio system how different types of antennas affect the coverage and interference pattern. The method is mainly characterized by the fact that signal strength values of an existing antenna are measured for its geographical position as otherwise called its relevant coordinates, the ideal difference in antenna gain is formed by mathematically "reducing" the ideal radiation pattern of the antenna which is to be simulated with the ideal radiation pattern of the existing antenna, and the measured field strength values are "weighted" with the ideal antenna gain difference to form a set of simulated field strength values

DETAILED DESCRIPTION OF THE INVENTION

The background of the present invention is a measuring technique which has recently been developed at Televerket Radio and which has opened up completely new possibilities for describing the wave propagation in a metropolitan area. The measuring method involves a measuring vehicle travelling through all thoroughfares and major roads in Stockholm and measuring the signals from basically all existing base stations This measuring method results in an exact knowledge of what signal strength and what interference signal strengths are received at a mobile unit wherever it is located in the greater Stockholm area These signals and interference signal strengths are also based on the complicated wave propagation medium with shadow effects, reflected waves and varying earth constants and also on antenna characteristics for base stations and mobile units. As a rule, a base station has a radiation pattern which is very complicated because of coupling to nearby objects. The antenna itself is only one component in the transmission path and, taken overall, there is probably better knowledge about its characteristics than the wave propagation medium.

An approximation which is fully acceptable for planning purposes can be carried out according to the present invention by using large-scale known characteristics for the antenna types and carrying out a weighting of signal strength values with the aid of a fictitious difference diagram.

For a measured radio cell, the characteristics of the existing antenna in combination with the wave propagation medium of the cell are known with very great accuracy. Moreover, the ideal characteristics of different antenna types are known in the form of radiation patterns. Where known large-scale characteristics of the antenna types are utilized, a simple difference measured in dB can be formed between the radiation pattern of the proposed antenna and the reference antenna, that is to say the existing antenna With the aid of this difference diagram, the signal strengths measured by the measuring vehicle can then be corrected with respect to the new proposed antenna.

The new coverages and interferences arising provide guidance in the radio cell planning procedure. Antennas can be turned thereby and/or the beam width changed. In cell planning, it can be ensured by this means that the least possible mutual interferences are produced, which increases the utilization of the allocated frequency band by the mobile radio system. When the cell planning has been implemented in the existing mobile radio system, the simulated results can be verified by renewed measurements in cells with adjusted antennas.

We claim:
1. A method for simulating the effect of alternative antenna patterns on the coverage and interference pattern in cellular radio systems, comprising a number of base stations with associated individual coverage areas and mobile stations, characterized in that signal strength values of an existing multi-directional antenna are measured for a plurality of relevant coordinates along a plurality of radials and at a plurality of distances from said existing antenna, an ideal difference in antenna gain is formed by mathematically comprising an ideal radiation pattern of the antenna which is to be simulated with the ideal radiation pattern of the existing antenna, and the measured field strength values are "weighted" with the ideal antenna gain difference to form a set of simulated field strength values.

2. A method according to claim 1, characterized in that a graph is produced by inserting the simulated field strength values instead of the measured field strength values in a plotting program for producing a coverage and interference pattern.

* * * * *